(12) United States Patent
Sugiura et al.

(10) Patent No.: US 6,686,217 B2
(45) Date of Patent: Feb. 3, 2004

(54) COMPOUND SEMICONDUCTOR DEVICE MANUFACTURING METHOD

(75) Inventors: Katsumi Sugiura, Yamanashi (JP); Chikashi Anayama, Yamanashi (JP); Akira Furuya, Yamanashi (JP)

(73) Assignee: Fujitsu Quantum Devices, Limited, Yamanashi (JP)

( * ) Notice: Subject to any disclaimer, the term of this patent is extended or adjusted under 35 U.S.C. 154(b) by 94 days.

(21) Appl. No.: 10/046,217

(22) Filed: Jan. 16, 2002

(65) Prior Publication Data

US 2002/0098666 A1 Jul. 25, 2002

(30) Foreign Application Priority Data

Jan. 19, 2001 (JP) ........................................ 2001-011885

(51) Int. Cl.[7] ............................................... H01L 21/00
(52) U.S. Cl. ......................... 438/29; 438/38; 438/39; 438/45; 438/46; 438/47
(58) Field of Search ........................ 438/29, 31, 38, 438/46, 47, 45, 39

(56) References Cited

U.S. PATENT DOCUMENTS

| | | | |
|---|---|---|---|
| 5,023,199 A | * | 6/1991 | Murakami et al. ............ 438/47 |
| 5,814,531 A | * | 9/1998 | Anayama et al. ............. 438/31 |
| 6,503,421 B1 | | 1/2003 | Wang et al. |
| 2003/0031446 A1 | | 2/2003 | Gao et al. |

OTHER PUBLICATIONS

International Search Report, mailed Aprl. 4, 2003.

* cited by examiner

Primary Examiner—Amir Zarabian
Assistant Examiner—Toniae Thomas
(74) Attorney, Agent, or Firm—Armstrong, Kratz, Quintos, Hanson & Brooks LLP

(57) ABSTRACT

A method of forming a compound semiconductor device. The method includes the steps of depositing a film that contains zinc oxide and silicon oxide to contain the zinc oxide by 70 wt % or more on compound semiconductor layer as a diffusion source, and diffusing zinc from the diffusion source into the compound semiconductor layer by annealing. Accordingly, there can be provided a compound semiconductor device manufacturing method containing the step of diffusing zinc into compound semiconductor layers, capable of deepening a Zn diffusion position from a ZnO/ $SiO_2$ film to such extent that COD endurance of laser end face window structures can be increased rather than the prior art.

3 Claims, 12 Drawing Sheets

US 6,686,217 B2

COMPOUND SEMICONDUCTOR DEVICE MANUFACTURING METHOD

CROSS-REFERENCE TO RELATED APPLICATIONS

This application is based upon and claims priority of Japanese Patent Application No. 2001-011885, filed in Jan. 19, 2001, the contents being incorporated herein by reference.

BACKGROUND OF THE INVENTION

1. Field of the Invention

The present invention relates to a compound semiconductor device manufacturing method.

2. Description of the Prior Art

In the semiconductor laser, since the active layer has a narrow energy band gap and its end face is exposed to the high optical density state in the laser oscillation, the optical absorption due to the nonluminous recombination is ready to occur at the end face. Then, when the operating output of the semiconductor laser is increased, an amount of optical absorption at the end face of the active layer is increased to then raise the temperature, and then the energy band gap is further reduced because of such temperature rise and thus an amount of optical absorption is increased further. In the end, the COD (Catastrophic Optical Damage) destruction is caused.

In order to suppress such COD destruction, it is known that the energy band gap of the active layer is widened by diffusing zinc (Zn) into the end face of the active layer of the semiconductor laser from the top.

The steps of forming the end face window structure of the semiconductor laser by diffusing the zinc will be explained with reference to FIGS. 1A to 1F hereunder. A cross section of the semiconductor laser along the resonator length direction is shown in FIGS. 1A to 1F.

First, as shown in FIG. 1A, the n-type cladding layer 102 formed of n-AlGaInP, the MQW active layer 103 formed of GaInP/AlGaInP, the p-type cladding layer 104 formed of p-AlGaInP, and the contact layer 105 formed of p-GaAs are formed in sequence on the n-GaAs substrate 101 by the MOVPE method.

Then, the diffusion preventing mask 106 of $SiO_2$ is formed on the contact layer 105 by the CVD method, and diffusion windows 106a are formed near the end faces by patterning the diffusion preventing mask 106.

In turn, as shown in FIG. 1B, the contact layer 105 is etched via the diffusion windows 106a.

Then, as shown in FIG. 1C, the $ZnO/SiO_2$ film 107 in which zinc oxide (ZnO) and silicon dioxide ($SiO_2$) are mixed by 50 wt % respectively and the cover film 108 formed of $SiO_2$ are formed in sequence in the diffusion windows 106a and on the diffusion preventing mask 106 by the sputter method. Here, it is considered that $SiO_2$ is needed by about 50 wt % to form the group III vacancies in the group III-V semiconductor layer.

Then, as shown in FIG. 1D, if Zn in the $ZnO/SiO_2$ film 107 is diffused into the MQW active layer 103 via the diffusion windows 106a by the annealing process, window structures 109 as the Zn-diffused regions are formed on the laser end faces.

Then, as shown in FIG. 1E, the diffusion preventing mask 106, the $ZnO/SiO_2$ film 107, and the cover film 108 are removed by etching, then the $SiO_2$ passivation film (not shown) is formed by the CVD, and then the long stripe-like opening (not shown) is formed in the resonator length direction by patterning the $SiO_2$ passivation film.

After this, as shown in FIG. 1F the p-side electrode 110 is connected to the contact layer 105 via the stripe-like opening, and the n-side electrode 111 is formed on the lower surface of the n-GaAs substrate 101. The laser beam is emitted in the direction indicated by an arrow in FIG. 1F.

Meanwhile, the increase of the energy band gap in the MQW layer due to the Zn diffusion depends on the Zn concentration as shown in FIG. 2. FIG. 2 shows the result measured by the photo luminescence (PL) method at the room temperature (25° C.), and the increase of the PL wavelength shift shows the increase of the energy band gap in the MQW layer.

When the window structures as the Zn-diffused regions are formed in the $S^3$ (Self-aligned Stepped Substrate)-type semiconductor laser in compliance with the steps shown in FIGS. 1A to 1F, the improvement of the COD level is not so found.

Therefore, when the Zn diffusion depth in the laser end face regions is evaluated by the SEM microphotograph, the zinc is diffused only up to about 0.15 µm under the active layer 103. It is considered that the shallow diffusion causes the event that the COD level is not improved.

However, based on the experiment made by inventors of the present invention, it becomes apparent that, in the case that the $ZnO/SiO_2$ film 107 in which ZnO and $SiO_2$ are contained by 50 wt % respectively is used as the Zn diffusion source, the Zn diffusion position cannot be extended deeper even when the annealing diffusion time is prolonged.

In order to extend the lower end of the Zn-diffused region (referred to as the "Zn diffusion front" hereinafter) deeper, the inventors of the present invention have considered that the deeper recesses should be provided physically in the wafer. However, since the fabrication processes become complicated, this approach is not preferable.

SUMMARY OF THE INVENTION

It is an object of the present invention to provide a compound semiconductor device manufacturing method that is capable of deepening a Zn-diffusion position from a $ZnO/SiO_2$ film to such extent that COD tolerate quantity of laser end face window structures can be increased rather than the prior art, or easily controlling a Zn diffusion front position by an annealing time of the $ZnO/SiO_2$ film.

According to the present invention, the zinc oxide/silicon oxide mixed film ($ZnO/SiO_2$ film) which contains zinc oxide by 70 wt % or more is deposited on the compound semiconductor layers, for example, the multi-layered structure semiconductor layers constituting the semiconductor laser, and then zinc is diffused into the compound semiconductor layers from the $ZnO/SiO_2$ film by annealing.

It is considered that, in view of the formation of the group III element vacancies by the silicon oxide, a contained amount of zinc oxide in the $ZnO/SiO_2$ film should be set to about 50 wt %. According to the experiment, if a contained amount of zinc oxide is set to almost 50 wt %, the Zn diffusion front becomes shallow and thus the COD level of the active layer of the semiconductor laser, for example, cannot be increased.

In contrast, it is confirmed by the experiment made by the inventors of the present invention that, if a contained amount of zinc oxide in the $ZnO/SiO_2$ film is set to about 70 wt % or more, the Zn diffusion front can be extended deeper, control of the depth can be facilitated by controlling the temperature and the time, and a contained amount of silicon oxide can be set lower than 50 wt %.

As a result, the laser window structure can be formed by diffusing the zinc up to the deep position under the end face regions of the active layer of the semiconductor laser, and also the COD level can be increased.

DESCRIPTION OF THE PREFERRED EMBODIMENT

An embodiment of the present invention will be explained with reference to the accompanying drawings hereinafter.

FIG. 3 to FIG. 9 are perspective views showing steps of forming an $S^3$-type semiconductor laser according to an embodiment of the present invention.

Figure 1A:
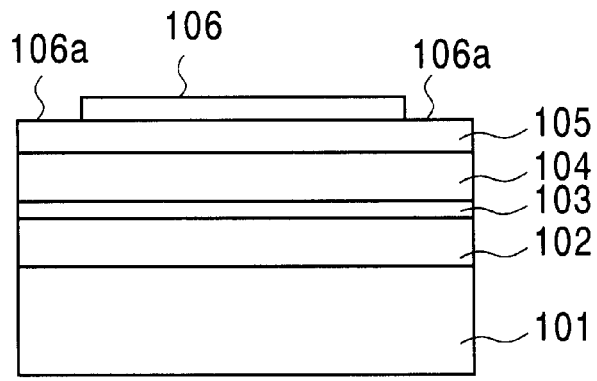
FIGS. 1A to 1F are sectional views showing steps of forming the semiconductor laser in the prior art.
Figure 1B:
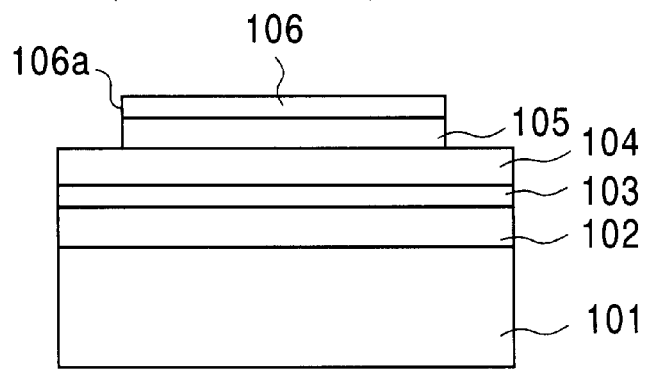
Figure 1C:
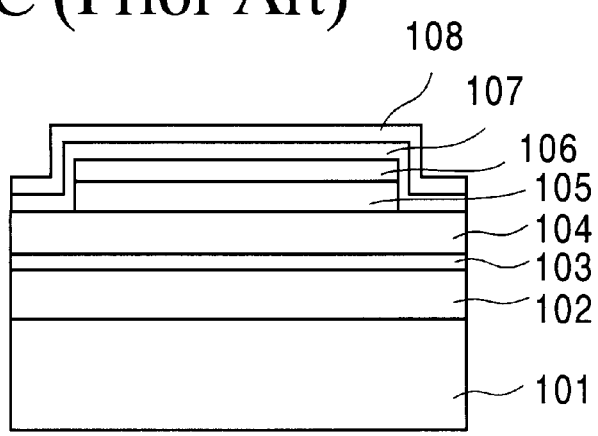
Figure 1D:
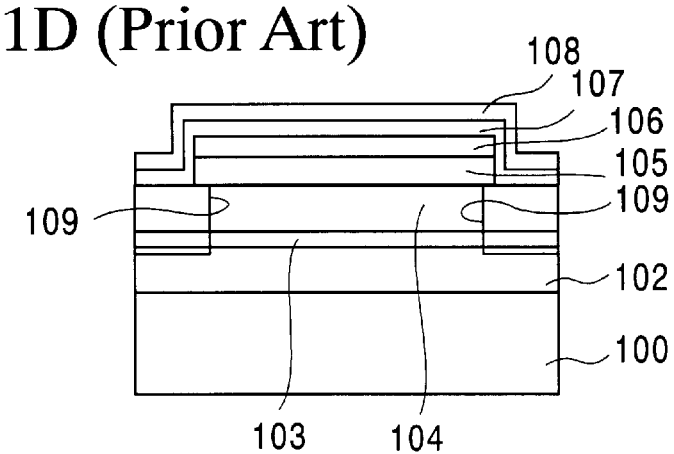
Figure 1E:
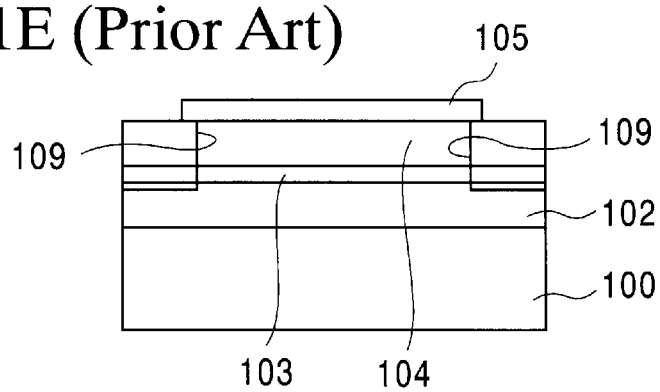
Figure 1F:
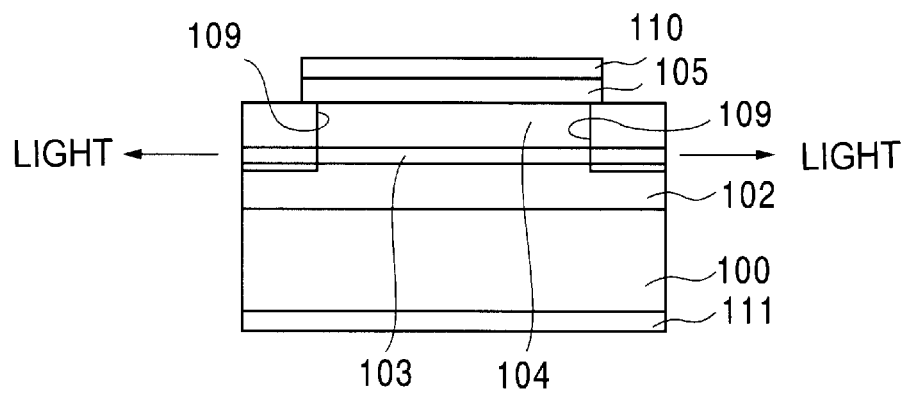
Figure 2:
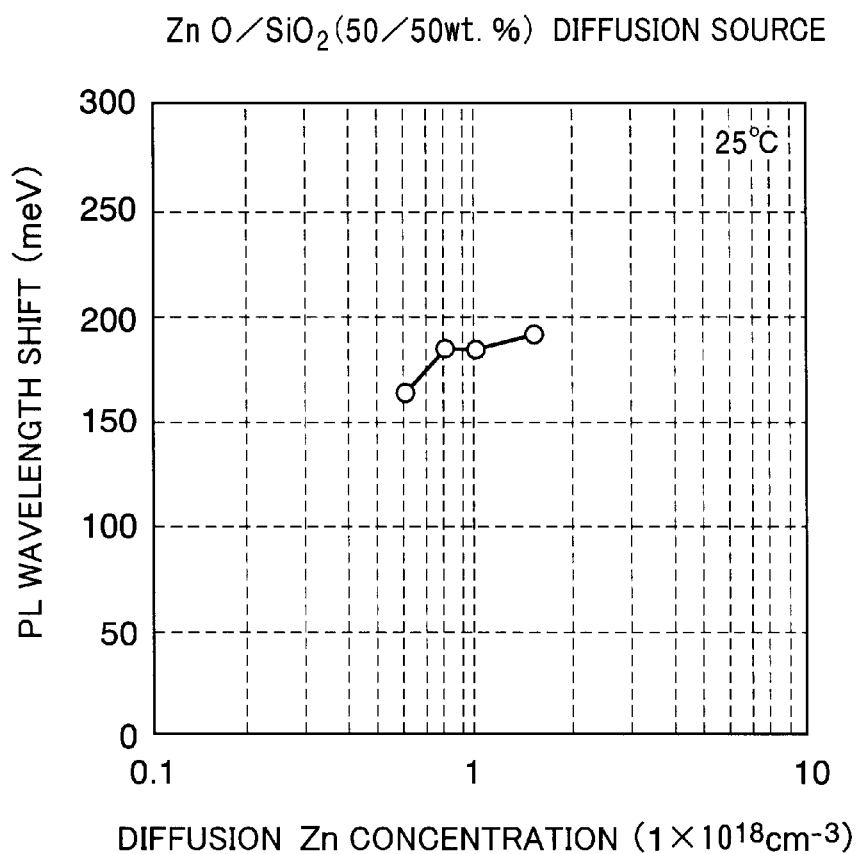
FIG. 2 is a graph showing a relationship between a concentration of zinc diffused into the active layer by using the $ZnO/SiO_2$ film and PL wavelength shift.
Figure 3:
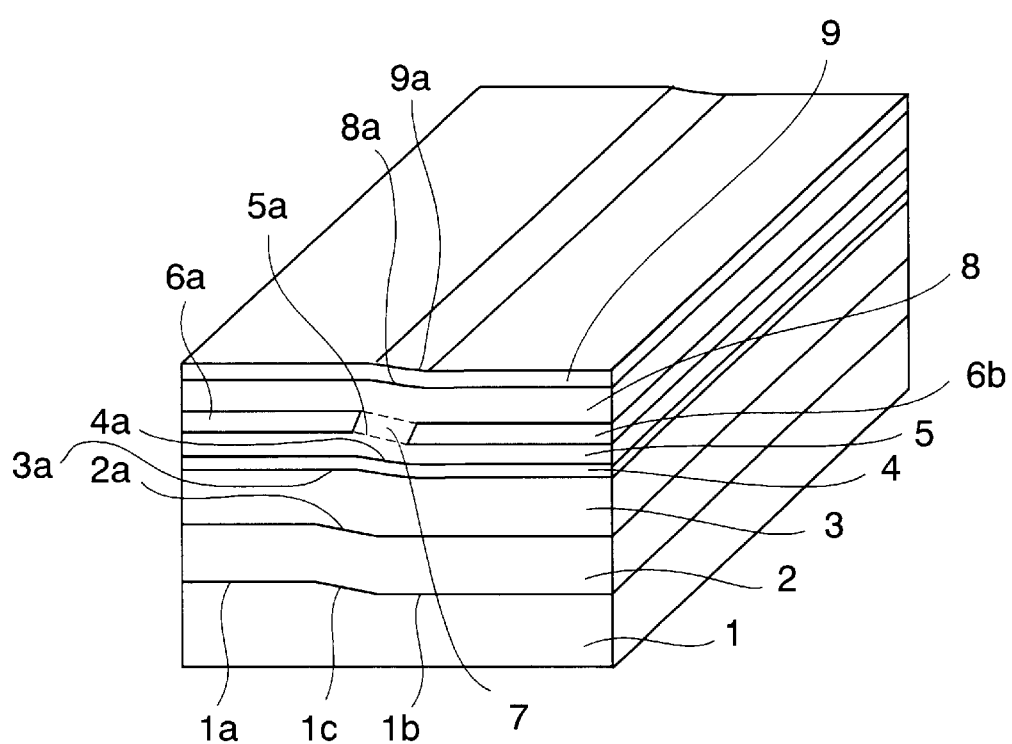
FIG. 3, FIG. 4, FIG. 5, FIG. 6, FIG. 7, FIG. 8 and FIG. 9 are perspective views showing steps of forming an $S^3$-type semiconductor laser according to an embodiment of the present invention.

Then, steps required until a multi-layered structure shown in FIG. 3 is formed will be explained hereunder.

An n-type GaAs substrate 1 whose principal plane is off from a (100) face by an angle of 6 degrees toward a (111) A face and which has a diameter of 2 inch is prepared. The silicon as the n-type impurity is doped into the n-GaAs substrate 1 at the concentration of about $4\times10^{18}$ cm$^{-3}$.

A level difference is formed on the principal plane by forming a stripe-like resist (not shown) on the principal plane of the n-GaAs substrate 1 and then etching the portion that is not covered with the resist up to a depth of about 0.5 μm by using the hydrogen fluoride-containing solution. If the principal plane that is covered with the resist is defined as an upper principal plane 1a and the principal plane that appears by the etching is defined as a lower principal plane 1b, a slope 1c that has a face orientation of about (411) A face and has a width of about 1.15 μm is formed at the boundary between the upper principal plane 1a and the lower principal plane 1b. This slope 1c is formed like a stripe that extends in a <011> direction, for example.

In turn, the resist is removed from the n-GaAs substrate 1, and then a buffer layer 2 formed of n-GaAs and having a thickness of 1.0 μm is formed on the upper principal plane 1a, the lower principal plane 1b, and the inclined plane 1c of the n-GaAs substrate 1. In the buffer layer 2, a slope 2a with the face orientation of about (411) A face appears on the inclined plane 1c of the n-GaAs substrate 1.

The GaAs layer constituting the buffer layer 2 is formed by the MOVPE method using triethylgallium (TEGa: $Ga(C_2H_5)_3$) and arsine ($AsH_3$) as the source gases. In growing the GaAs layer, the n-type impurity is introduced by using disilane ($Si_2H_6$) as the n-type dopant material. The n-type impurity concentration in the buffer layer 2 is set to about $5\times10^{17}$ cm$^{-3}$.

A plurality of layers from the buffer layer 2 to a contact layer 9 described later are formed continuously as a whole by the MOVPE method under the conditions of the substrate temperature 680° C. and the growth atmospheric pressure 50 Torr. The source gas to grow these layers is supplied together with the hydrogen carrier gas to the growth atmosphere.

Then, an n-type cladding layer 3 made of n-$(Al_{0.7}Ga_{0.3})_{0.5}In_{0.5}P$ having an about 1.5 μm thickness is formed on the buffer layer 2. In growing the n-type cladding layer 3, trimethylalluninum (TMAl: $Al(CH_3)_3$), TEGa, trimethylindium (TMIn), and phosphine are used, and disilane is used as the n-type dopant, and also the n-type impurity concentration in the n-type cladding layer 3 is set to $5\times10^{17}$ cm$^{-3}$. The n-type cladding layer 3 has upper slopes 3a that are parallel with the inclined plane 1c of the n-GaAs substrate 1 and a flat surface that is parallel with the principal planes 1a, 1b of the n-GaAs substrate 1 and connected to the upper slopes 3a.

In turn, an MQW active layer 4 and a first p-type cladding layer 5 are formed in sequence on the n-type cladding layer 3, and first and second n-type current strangulated layers 6a, 6b and a second p-type cladding layer 7 are formed thereon.

The MQW active layer 4 has a stripe-like slope 4a that is parallel with the slope 3a of the n-type cladding layer 3 and has a width of 1.15 μm. Also, the first p-type cladding layer 5 has an upper slope 5a that is parallel with the upper slope 4a of the MQW active layer 4.

The MQW active layer 4 is constructed by three periods of $Ga_{0.42}In_{0.58}P$ quantum well layer of 5 nm thickness and $(Al_{0.5}Ga_{0.5})_{0.5}In_{0.5}P$ barrier layer of 5 nm thickness. The quantum well layer is formed by using TEGa, TMIn, and phosphine as the source gases, and the barrier layer is formed by using TMAl, TEGa, TMIn, and phosphine as the source gases.

The first p-type cladding layer 5 is formed of a p-$(Al_{0.7}Ga_{0.3})_{0.5}In_{0.5}P$ layer having a thickness of 0.6 μm. In order to grow the first p-type cladding layer 5, TMAl, TEGa, TMIn, and phosphine are used as the source gases, and diethyl zinc (DEZ:$(C_2H_5)_2Zn$) is used as the p-type dopant. The p-type impurity concentration in the first p-type cladding layer 5 is set to $7\times10^{17}$ cm$^{-3}$ in the region of the upper slope 5a and is set to $1.2\times10^{17}$ cm$^{-3}$ in the region of the flat surface.

The n-type current strangulated layers 6a, 6b and the second p-type cladding layer 7 are formed simultaneously by the pn alternative doping. More particularly, if the $(Al_{0.7}Ga_{0.3})_{0.5}In_{0.5}P$ layer is formed on the first p-type cladding layer 5 while supplying the n-type dopant and the p-type dopant alternatively, depending on the face orientation dependency of the incorporation ratios of the n-type dopant and the p-type dopant, the n-type dopant is preferentially incorporated onto the flat surface of the first p-type cladding layer 5 to grow the n-type $(Al_{0.7}Ga_{0.3})_{0.5}In_{0.5}P$ layer, and also the p-type dopant is preferentially incorporated onto the upper slope 5a of the first p-type cladding layer 5 to grow the p-type $(Al_{0.7}Ga_{0.3})_{0.5}In_{0.5}P$ layer. The n-type $(Al_{0.7}Ga_{0.3})_{0.5}In_{0.5}P$ layer acts as the n-type current strangulated layers 6a, 6b and the p-type $(Al_{0.7}Ga_{0.3})_{0.5}In_{0.5}P$ layer acts as the second p-type cladding layer 7.

Both the n-type current strangulated layers 6a, 6b and the second p-type cladding layer 7 are formed to have a thickness of 0.35 µm, by using TMAl, TEGa, TMIn, and phosphine as the source gases while supplying DEZ as the p-type dopant and $H_2Se$ as the n-type dopant alternatively.

Accordingly, the second p-type cladding layer 7 is formed on the slope 5a of the first p-type cladding layer 5, and the first and second n-type current strangulated layers 6a, 6b are formed on the flat surface of the first p-type cladding layer 5 on both sides of the slope 5a. For example, the substantial p-type impurity concentration of the second p-type cladding layer 7 is set to $7 \times 10^{17}$ cm$^{-3}$ and the substantial n-type impurity concentration of the first and second n-type current strangulated layers 6a, 6b is set to $6 \times 10^{17}$ cm$^{-3}$.

Then, a third p-type cladding layer 8 formed of p-$(Al_{0.7}Ga_{0.3})_{0.5}In_{0.5}P$ is formed on the n-type current strangulated layers 6a, 6b and the second p-type cladding layer 7 to have a thickness of 0.75 µm. In order to grow the third p-type cladding layer 8, TMAl, TEGa, TMIn, and phosphine are used as the source gases, and DEZ is used as the p-type dopant. The p-type impurity concentration in the third p-type cladding layer 8 is set to $7 \times 10^{17}$ cm$^{-3}$ in the region of the slope 8a and is set to $1.2 \times 10^{17}$ cm$^{-3}$ in the region of the flat surface. The slope 8a that is parallel with the upper slope 5a of the first p-type cladding layer 5 is formed in the third p-type cladding layer 8.

As a result, since the first and third p-type cladding layers 5, 8 are formed under and on the first and second n-type current strangulated layers 6a, 6b respectively, pnp junctions are present over both sides of the slope 4a of the MQW active layer 4.

Then, a contact layer 9 formed of p$^+$-type GaAs is formed on the third p-type cladding layer 8. In order to grow the GaAs layer, the contact layer 9 uses TEGa and arsine as the source gases and uses DEZ as the p-type dopant. This contact layer 9 has a slope 9a that is parallel with the slope 8a of the third p-type cladding layer 8, and the p-type impurity concentration is set to $2 \times 10^{18}$ cm$^{-3}$ in the region of the slope 9a, for example.

With the above, the growth of respective compound semiconductor layers by the MOVPE method is completed.

Figure 4:
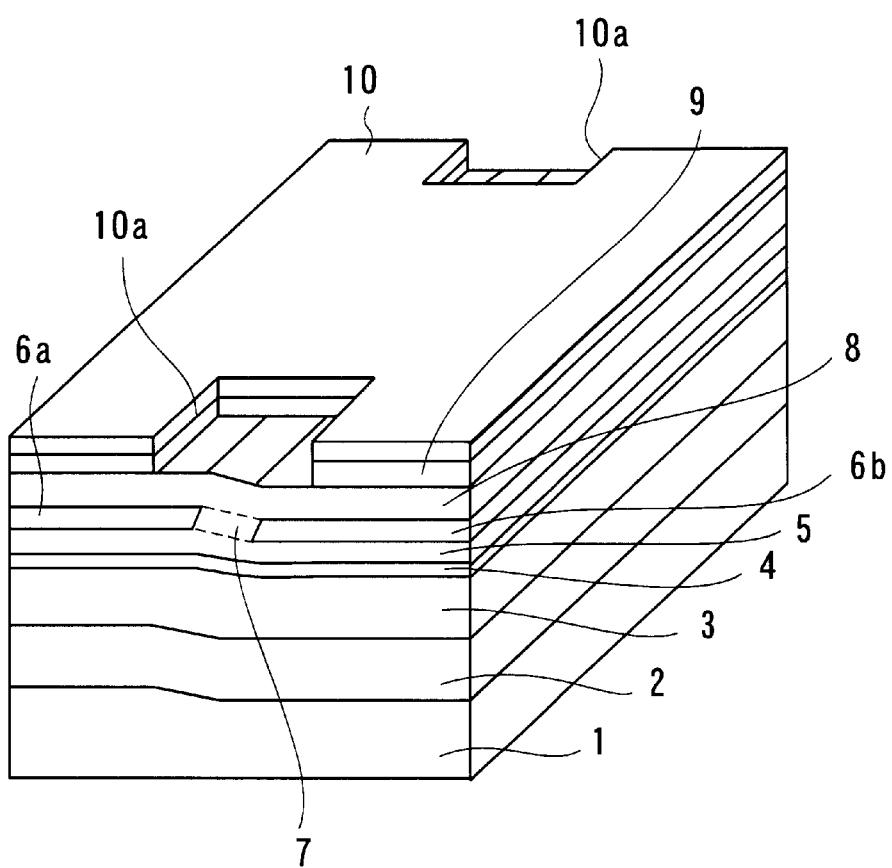

Next, steps required until the structure shown in FIG. 4 will be explained hereunder.

First, a diffusion preventing film 10 formed of $SiO_2$ is formed on the contact layer 9 by the CVD method to have a thickness of about 200 nm. Then, diffusion windows (openings) 10a each having a size of 10 µm×10 µm for example are formed above both end faces of the slope 4a of the MQW active layer 4 and above around the both end faces by patterning the diffusion preventing film 10 by virtue of the photolithography method using the resist and hydrofluoric acid.

Then, a part of the third p-type cladding layer 8 is exposed by removing the contact layer 9 through the diffusion windows 10a by virtue of etching using the hydrofluoric acid-containing solution.

Figure 5:
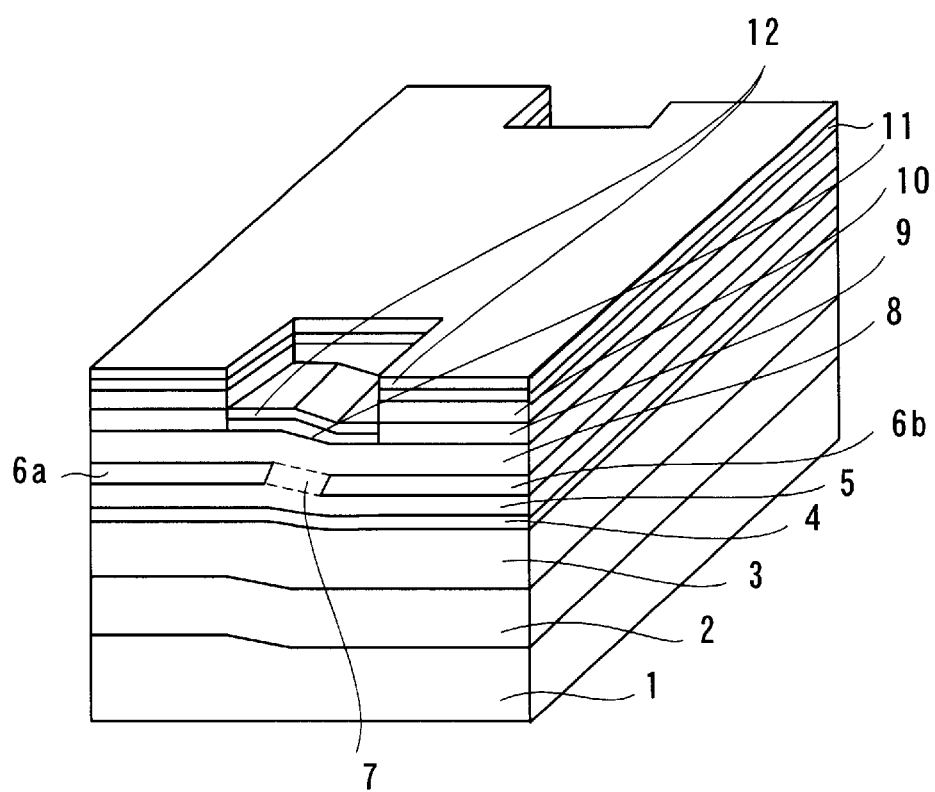

Then, as shown in FIG. 5, a $ZnO/SiO_2$ film 11 as the Zn diffusion source is formed on the diffusion preventing film 10 and on the third p-type cladding layer 8 in the diffusion windows 10a, by the RF sputter method using the target that is formed of mixture containing ZnO and $SiO_2$ at a rate of 70 to 90 wt % and 30 to 10 wt % respectively, to have a thickness of 200 nm. In addition, a cover film 12 formed of $SiO_2$ is formed on the $ZnO/SiO_2$ film 11 by the CVD method, to have a thickness of 100 nm.

Figure 6:
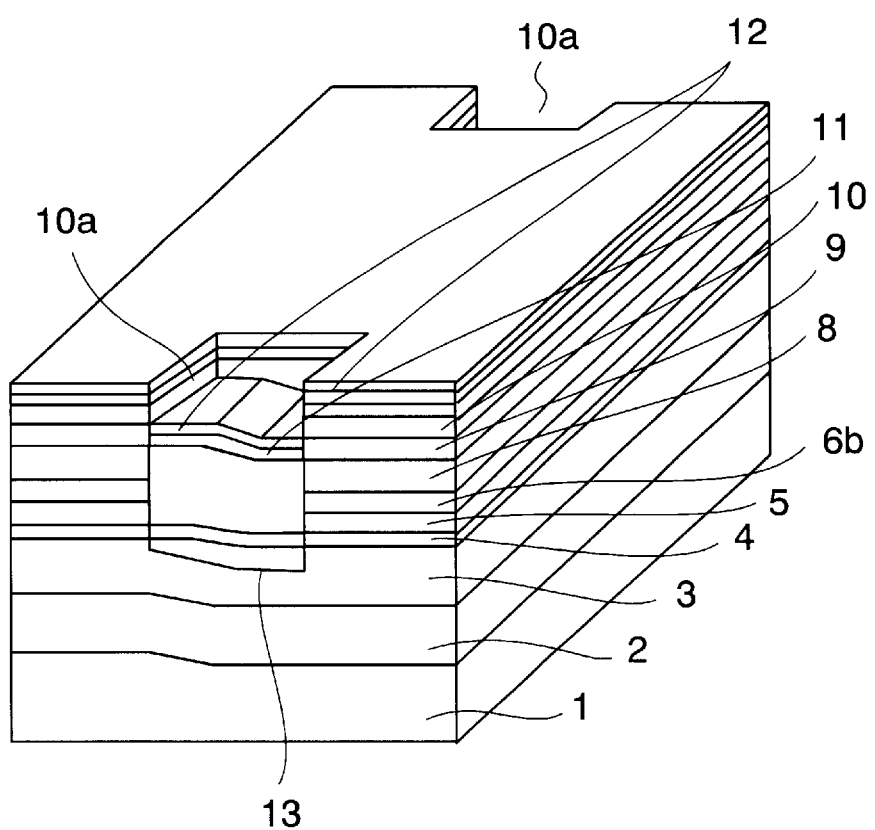

Then, as shown in FIG. 6, the GaAs substrate 1 on which the cover film 12, the $ZnO/SiO_2$ film 11, etc. are formed is placed into the nitrogen atmosphere. Then, the zinc (Zn) in the $ZnO/SiO_2$ film 11 is diffused into both end portions of the MQW active layer 4 via the diffusion windows 10a by annealing the substrate 1 at 550° C. for 20 minutes, for example. The $SiO_2$ in the $ZnO/SiO_2$ film 11 is used to form the group III vacancies in the group III-V semiconductor layer.

Accordingly, a Zn diffusion window structure 13 is formed below the diffusion windows 10a up to a depth of 0.7 µm from the MQW active layer 4. Thus, the energy band gap of the MQW active layer 4 is extended within the Zn-diffused window structures 13 and the n-type current strangulated layers 6a, 6b substantially disappear therein.

Figure 7:
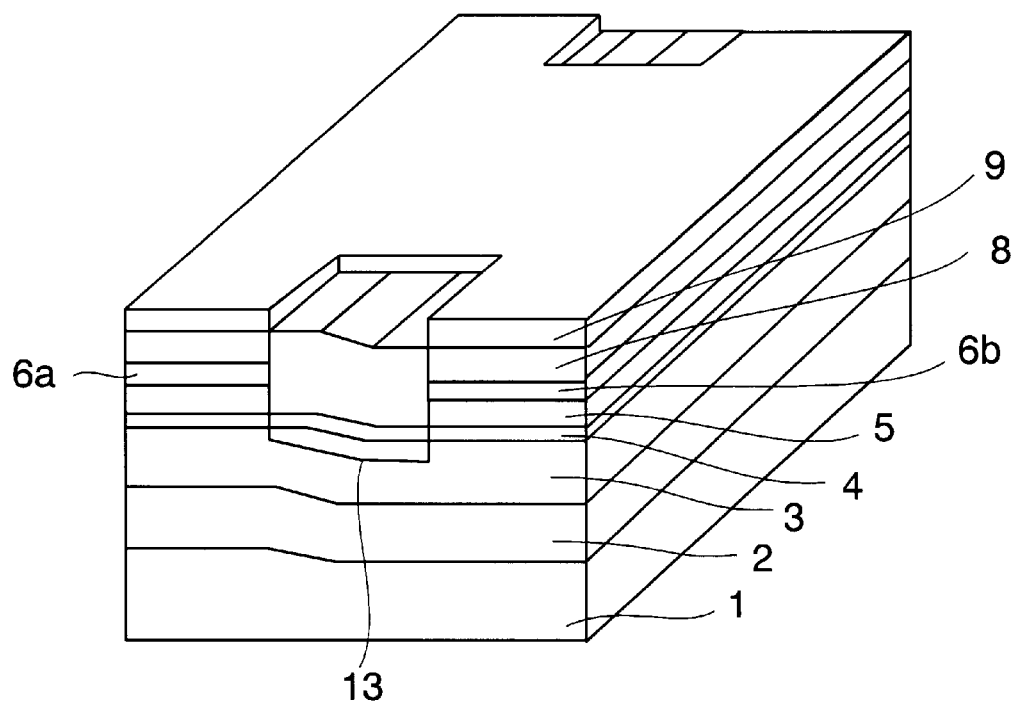

Then, as shown in FIG. 7, the cover film 12, the $ZnO/SiO_2$ film 11, and the diffusion preventing film 10 are removed by the hydrofluoric acid (HF), for example.

Figure 8:
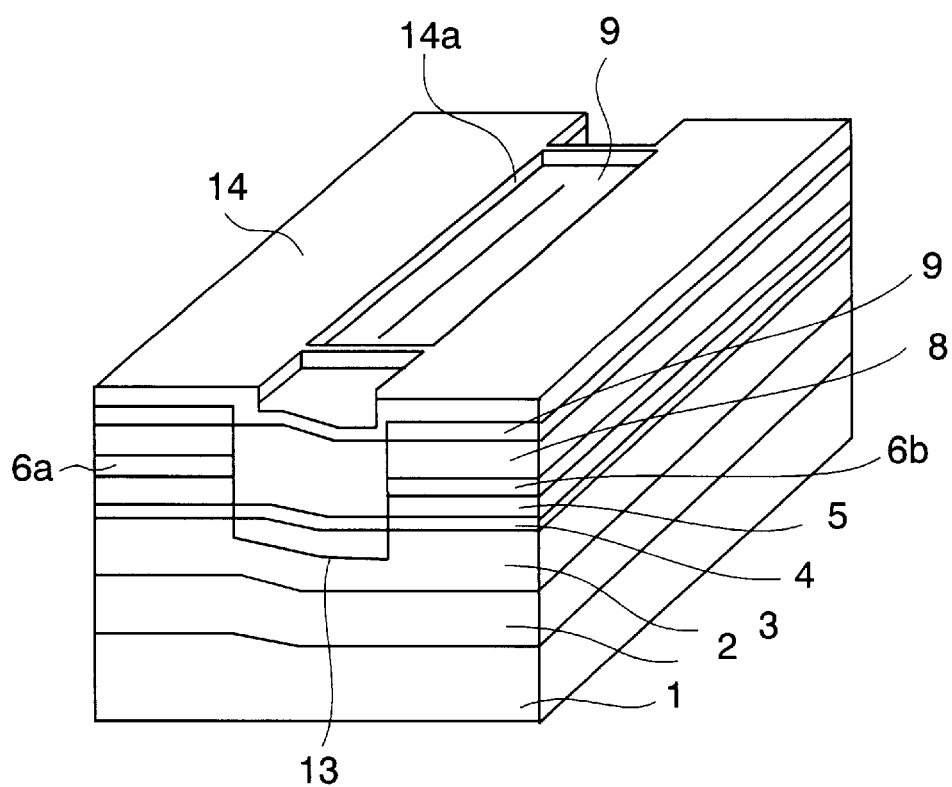

After this, as shown in FIG. 8, a passivation film 14 formed of $SiO_2$ is formed on the contact layer 9 and the window structures 13. Then, a stripe-like opening 14a is formed along the slope 8a of the third p-type cladding layer 8 by patterning the passivation film 14.

Figure 9:
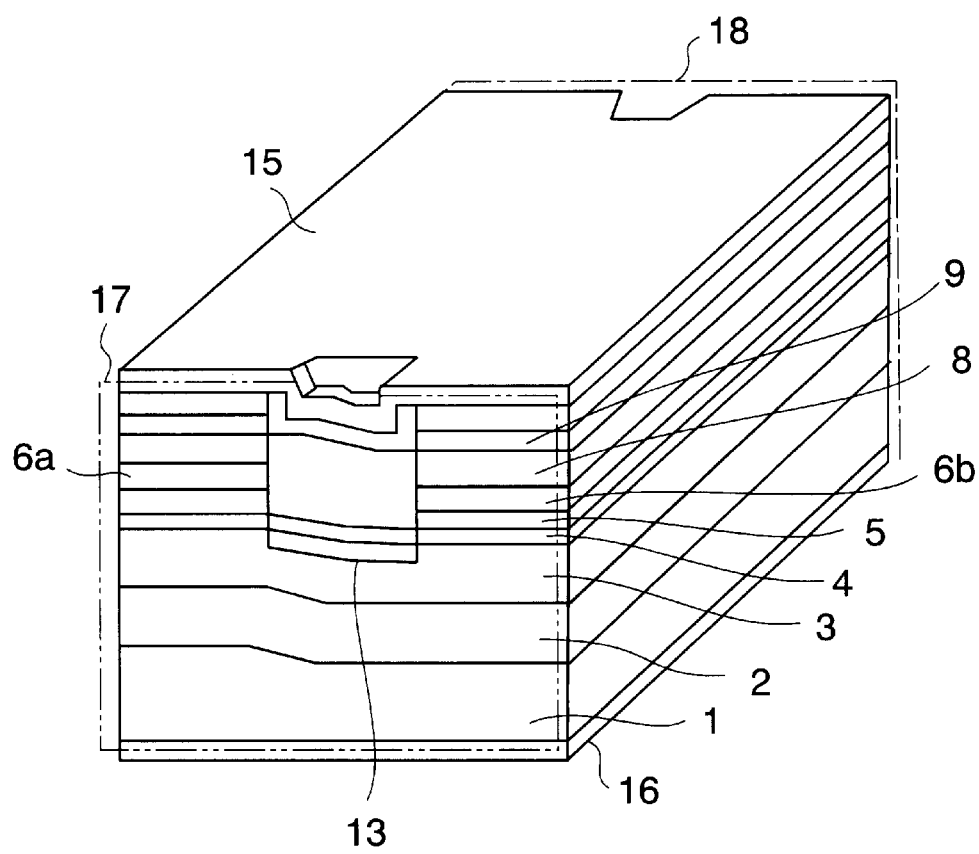

Then, as shown in FIG. 9, a p-side electrode 15 that is formed of Au/Zn/Au and is connected to the contact layer 9 via the stripe-like opening 14a is formed on the passivation film 14. Then, an n-side electrode 16 formed of Au/AuGe is formed on the lower surface of the n-GaAs substrate 1.

After this, an HR (High-Reflection) film 17 is formed on one end surface side of the MQW active layer 4, and an AR (Anti-Reflection) film 18 is formed on the reflection surface.

Figure 10:
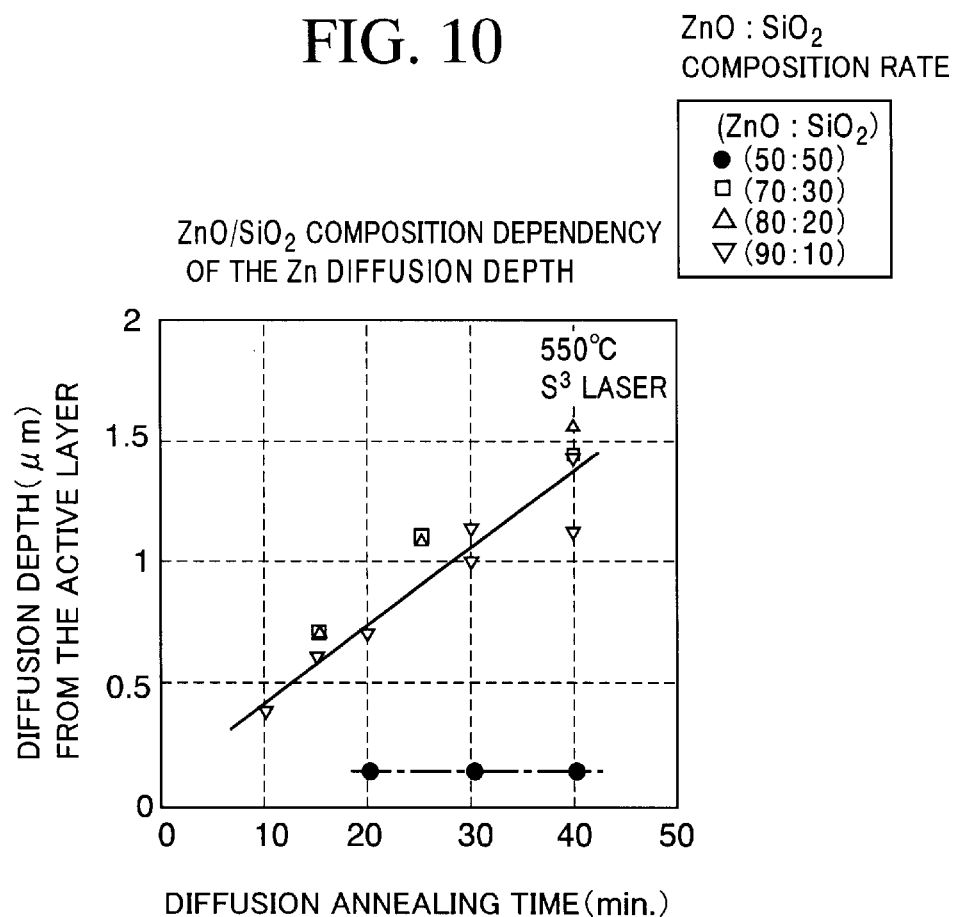
FIG. 10 is a graph showing a relationship between a diffusion depth of the zinc diffused by using the $ZnO/SiO_2$ film according to the embodiment of the present invention and a diffusion annealing time, and a relationship between a diffusion depth of the zinc diffused by using the $ZnO/SiO_2$ film in the prior art and the diffusion annealing time.

Meanwhile, in the above $S^3$-type semiconductor laser manufacturing steps, when the experiment to anneal/diffuse at 550° C. is made in order to check how the rate of ZnO and $SiO_2$ in the $ZnO/SiO_2$ film used as the Zn diffusion source should affect the Zn diffusion front, results shown in FIG. 10 are obtained. In this case, the results shown in FIG. 10 are derived under the same conditions except the composition of the Zn diffusion source.

A dot-dash line with black round marks in FIG. 10 indicates the Zn diffusion depth when ZnO and $SiO_2$ are set to 50 wt % respectively. Even if the annealing/diffusing time is prolonged longer, the zinc is not further diffused downwardly to exceed 0.15 µm from the MQW active layer 4.

In contrast, □, △, ▽ in FIG. 10 indicate the Zn diffusion depths when a rate ($ZnO/SiO_2$) of $SiO_2$ and ZnO is set to 70 wt %/30 wt %, 80 wt %/20 wt %, and 90 wt %/10 wt % respectively. The Zn diffusion depth can be extended to the position that is deeper than 0.15 µm below the MQW active layer 4, for example, to the depth of 0.4 µm to 1.4 µm. In addition, if the rate of ZnO in the $ZnO/SiO_2$ film is in excess of 70 wt %, it is possible to increase the Zn diffusion depth (diffusion front) as the annealing/diffusing time is prolonged longer, and thus the control of the depth can be facilitated.

In this case, $SiO_2$ in the $ZnO/SiO_2$ film is needed by at least 10 wt %.

Figure 11:
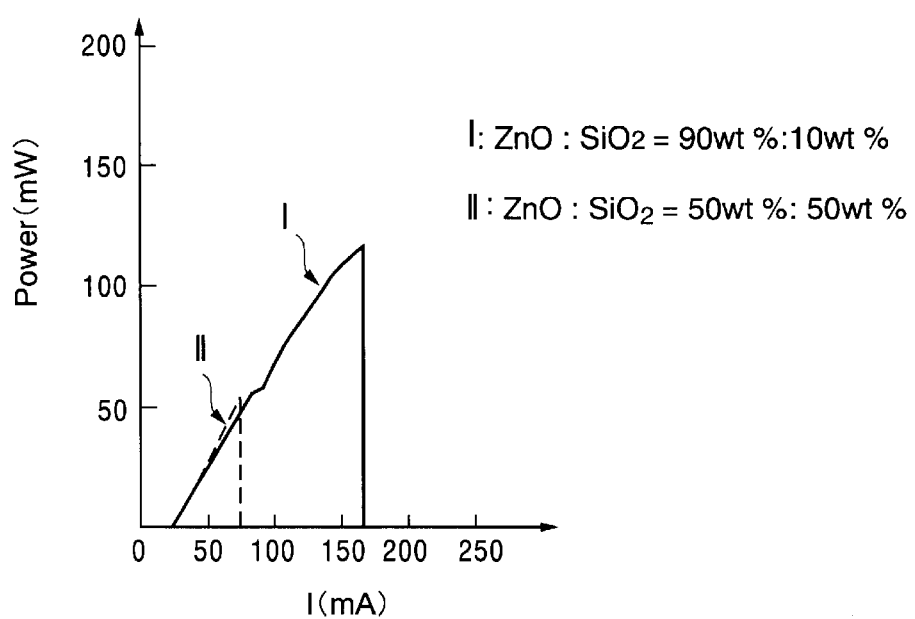
FIG. 11 is a view showing current/output characteristics of the $S^3$-type semiconductor laser according to the embodiment of the present invention and current/output characteristics of the $S^3$-type semiconductor laser in the prior art.

When the Zn diffusion window structures of the $S^3$-type semiconductor laser are formed by diffusing Zn until the depth that is deeper than the MQW active layer 4 by 0.15 µm, while using the $ZnO/SiO_2$ film in which the rate of $SiO_2$ to ZnO is set to 50 wt %/50 wt %, and then the current/output relationship of such $S^3$-type semiconductor laser is measured, the characteristic as indicated by a broken line in FIG. 11 is derived.

In contrast, when the Zn diffusion window structures 13 of the $S^3$-type semiconductor laser are formed by diffusing Zn at the temperature of 550° C. for 20 minutes until the depth that is deeper than the MQW active layer 4 by 0.7 μm, while using the $ZnO/SiO_2$ film 11 in which the rate of $SiO_2$ to ZnO is set to 90 wt %/10 wt %, and then the current/output relationship of such $S^3$-type semiconductor laser is measured, the characteristic as indicated by a solid line in FIG. 11 is derived. It is found that the COD level can be improved twice or more rather than the characteristic indicated by the broken line in FIG. 11.

If the Zn diffusion window structures 13 formed by the Zn diffusion has the depth that is almost parallel with the slope of the active layer 4 and is lower than the active layer 4 by 0.3 μm, the sufficient COD level can be achieved.

In the above embodiment, the semiconductor laser is explained. In the case that it is wished that the zinc should be diffused from the $ZnO/SiO_2$ film to the depth that is deeper than about 1.85 μm under the upper surface of the compound semiconductor layer, the diffusion depth can be easily controlled if the $ZnO/SiO_2$ film containing ZnO as the diffusion source by 70 wt % or more is used as the diffusion source. In other words, Zn is the p-type dopant and used to form the p-type region of the compound semiconductor device such as the light receiving element, EL, etc. Thus, if the $ZnO/SiO_2$ film including ZnO of 70 wt % or more as the diffusion source is used in such compound semiconductor device manufacturing steps, the diffusion depth of zinc can be easily controlled with adjusting the ZnO ratio.

As described above, according to the present invention, the zinc oxide/silicon oxide mixed film ($ZnO/SiO_2$ film) which contains the zinc oxide by 70 wt % or more is deposited on the compound semiconductor layers, for example, the multi-layered structure semiconductor layers constituting the semiconductor laser, and then zinc is diffused into the compound semi conductor layers from the $ZnO/SiO_2$ film by annealing. Therefore, the Zn diffusion front can be extended deeper, and also it becomes easy to control the depth by controlling the temperature and the time. As a result, the laser window structure can be formed by diffusing the zinc up to the deep position under the end face regions of the active layer of the semiconductor laser, and also the COD level can be increased.

What is claimed is:

1. A compound semiconductor device manufacturing method comprising the steps of:

depositing a zinc diffusion film comprising zinc oxide and silicon oxide wherein zinc oxide is present in an amount of 70 wt % or more as a diffusion source, on a compound semiconductor layer having a multi-layered structure, said semiconductor layer constitutes a semiconductor laser, and diffusing zinc from said zinc diffusion film into said compound semiconductor layer by annealing, wherein said compound semiconductor layer is formed by the steps comprising, forming a first conductivity type cladding layer on a substrate that has an inclined plane and flat faces on both sides of said inclined plane, forming an active layer on said first conductivity type cladding layer, forming a lower portion of a second conductivity type cladding layer on said active layer, forming an intermediate layer portion of said second conductivity type cladding layer on a region that is substantially parallel with said inclined plane of said substrate and also forming first conductivity type current strangulated layers on regions that are parallel with flat surfaces of said substrate, by growing compound semiconductor on said lower portion of said second conductivity type cladding layer while doping a first conductivity type dopant and a second conductivity type dopant alternatively, and forming an upper portion of said second conductivity type cladding layer on said first conductivity type current strangulated layers and said intermediate portion of said second conductivity type cladding layer, whereby said zinc from said zinc diffusion film is diffused to a position that is lower than said active layer by controlling an annealing time and a temperature.

2. A compound semiconductor device manufacturing method according to claim 1, wherein the zinc diffusion layer is deposited on an optical output end face of the compound semiconductor layers of the semiconductor laser and regions located over a neighboring region of the end faces, and then the laser window structure is formed by the diffusion of the zinc.

3. A compound semiconductor device manufacturing method according to claim 1, wherein the active layer is formed of AlGaInP/GaInAsP.

* * * * *

UNITED STATES PATENT AND TRADEMARK OFFICE
CERTIFICATE OF CORRECTION

PATENT NO. : 6,686,217 B2
DATED : February 3, 2004
INVENTOR(S) : Katsumi Sugiura et al.

It is certified that error appears in the above-identified patent and that said Letters Patent is hereby corrected as shown below:

<u>Title page,</u>
Item [73], Assignee, change "Fujitsu Quantum Devices, Limited, Yamanashi (JP)" to be -- Fujitsu Quantum Devices Limited, Yamanashi (JP) --

Signed and Sealed this

Twenty-first Day of December, 2004

JON W. DUDAS
*Director of the United States Patent and Trademark Office*